United States Patent [19]

Takagi

[11] Patent Number: 4,885,629

[45] Date of Patent: Dec. 5, 1989

[54] SEMICONDUCTOR APPARATUS

[75] Inventor: Yoshio Takagi, Itami, Japan

[73] Assignee: Mitsubishi Denki Kabushiki Kaisha, Tokyo, Japan

[21] Appl. No.: 517,712

[22] Filed: Jul. 27, 1983

[30] Foreign Application Priority Data

Aug. 7, 1982 [JP] Japan .................................. 57-138181

[51] Int. Cl.⁴ ...................... H01L 25/10; H01L 23/48
[52] U.S. Cl. ......................................... 357/68; 357/75
[58] Field of Search .................... 307/443; 357/75, 68; 339/28, 29 R, 17 N, 18 R, 18 B, 159

[56] References Cited

U.S. PATENT DOCUMENTS

| | | | |
|---|---|---|---|
| 3,085,220 | 4/1963 | Sitz | 339/18 B |
| 3,227,989 | 1/1966 | Wilm et al. | 339/18 R |
| 3,581,268 | 4/1969 | Akst | 339/18 R |
| 3,706,955 | 12/1972 | Bunnell | 339/28 |
| 4,001,571 | 1/1977 | Martin | 339/28 |
| 4,134,045 | 1/1979 | Quin | 339/29 R |
| 4,410,224 | 10/1983 | Giulie | 339/18 R |

OTHER PUBLICATIONS

"Flexible Tape Conductor Interconnection for Chips", -Auletta et al.-IBM Technical Disclosure-vol. 24, No. 2,-7-1981-pp. 1214-1215.
Handbook of Wiring, Cabling, and Interconnecting for Electronics, pp. 1-152, (McGraw-Hill Book Company 1972).

Primary Examiner—Rolf Hille
Assistant Examiner—S. V. Clark
Attorney, Agent, or Firm—Lowe, Price, LeBlanc, Becker & Shur

[57] ABSTRACT

A semiconductor apparatus having a plurality of electrodes comprises two external terminals provided for each electrode for being coupled to an input signal.

4 Claims, 2 Drawing Sheets

SEMICONDUCTOR APPARATUS

BACKGROUND OF THE INVENTION

1. Field of the Invention

The present invention relates to a semiconductor apparatus, and, more particularly, to a semiconductor apparatus including input signal terminals provided for each electrode so that a control signal is applied to a plurality of semiconductor apparatuses connected in parallel with each other.

2. Description of the Prior Art

This kind of semiconductor apparatus comprises a semiconductor power module. By way of an example, such semiconductor power module will be described in the following.

FIG. 1 shows a perspective view of a conventional semiconductor power module. The power module 1 contains two transistor devices therein. A common collector-emitter electrode terminal 2, an emitter electrode terminal 3 and a collector electrode terminal 4 are provided, as main electrode terminals, on the upper surface of the power module 1. An input signal terminal comprises a base signal terminal 5 and emitter signal terminal 6 for one transistor device, and a base signal terminal 8 and an emitter signal terminal 7 for the other transistor device, as shown in FIG. 1. A single input signal terminal is provided for each electrode.

In general, a plurality of semiconductor power modules have been often used in a parallel connected manner so that the plurality of semiconductor power modules are operated in response to a single control signal. FIG. 2 shows a conventional parallel connection of the plurality of power modules 1, 1, ... in which each signal terminal is connected in parallel with each other. More particularly, a control signal generating apparatus 9 is connected to the base signal terminal 5 in the first power module 1 through a wire 11a. The base signal terminal 5 in the first power module 1 is also connected to the base signal terminal 5 in the second power module 1, which is, in turn, connected to the base signal terminal 5 in the third power module, and so on. Similarly, as shown in a dotted line, each of emitter signal terminals 6, 6, ... of the power modules 1, 1, ... is connected in parallel with each other. The signal terminals 7 and 8 in each power module are also connected in parallel in the same manner.

As described in the foregoing, each semiconductor power module 1 comprises a single signal terminal for each electrode and thus, a wiring apparatus 10 for parallel connection for transmitting a control signal from the control signal generating apparatus 9 is structured as shown in FIG. 3. The wiring apparatus 10 comprises a plurality of contacts 12, wires 11 connected therebetween and a wire 11a connected between the control signal generating apparatus and the first contact corresponding to the first power module. The number of contacts 12 corresponds to the number of the power modules to be connected in parallel. A serial connection of the plurality of contacts and the wires 11 and 11a constitutes a single continuous wiring apparatus 10 for parallel connection. By using such wiring apparatus 10, more particularly, by inserting each connecting contact 12 into a corresponding signal terminal, a plurality of power modules are connected in parallel with each other.

However, in the above described conventional power module 1, a continuous wiring apparatus structured as shown in FIG. 3 is required for connecting the signal terminals in the plurality of power modules in parallel with each other and, in addition, if the number of the parallel connections that is, the number of the power modules changes, the wiring apparatus 10 must be correspondingly reconstructed.

SUMMARY OF THE INVENTION

Briefly stated, the present invention is directed to a semiconductor apparatus having a plurality of electrodes, comprising two external signal terminals provided for each electrode for being coupled to an input signal.

A present invention is also directed to an arrangement including at least two semiconductor apparatuses connected in parallel, each semiconductor apparatus comprising two external signal terminals provided for each electrode for being connected to an input signal. There is also provided wiring means for connecting two semiconductor apparatuses in parallel, the wiring means including a connecting wire having two ends and two contacts each connected to one end of the wire for being detachably connected to the external signal terminal of the semiconductor apparatus.

In accordance with the present invention, since the two signal terminals are provided for each electrode in each semiconductor apparatus, even if the number of the parallel connections of the semiconductor apparatuses changes, it is easy to arrange such parallel connection by changing the number of wiring apparatuses, each being comprised of a wire and two connecting contacts each connected to one end of the wire, depending on the change of the number of the parallel connections.

Accordingly, a principal object of the present invention is to provide a semiconductor apparatus having a plurality of electrodes, comprising two signal terminals provided for each electrode for being coupled to an input signal.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
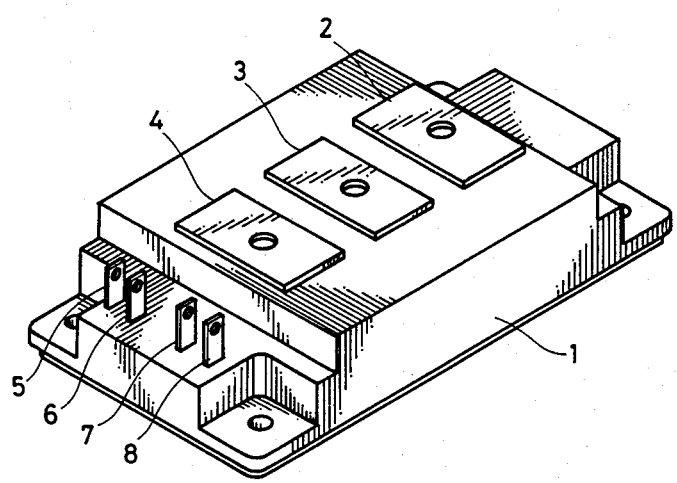
FIG. 1 is a perspective view of a conventional semiconductor power module.
Figure 2:
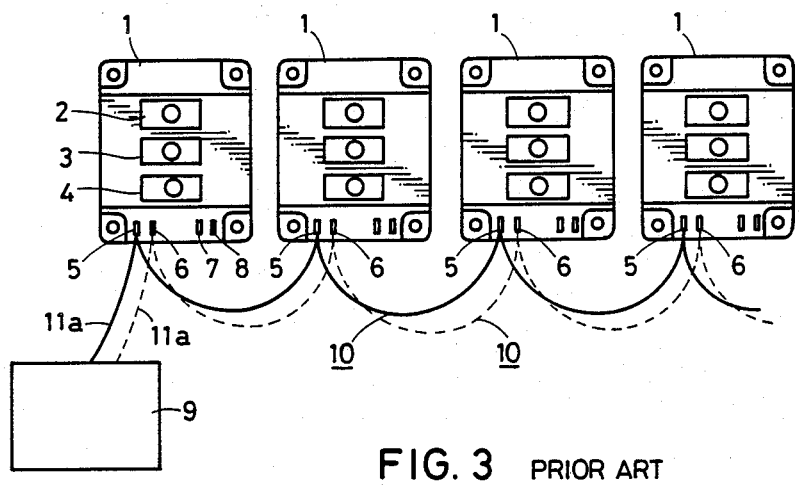
FIG. 2 is a plan view showing a parallel connection of a plurality of conventional power module.
Figure 3:
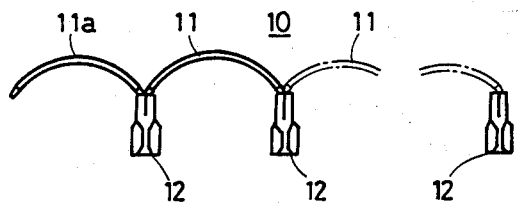
FIG. 3 is a front view showing a conventional wiring apparatus for parallel connection.
Figure 4:
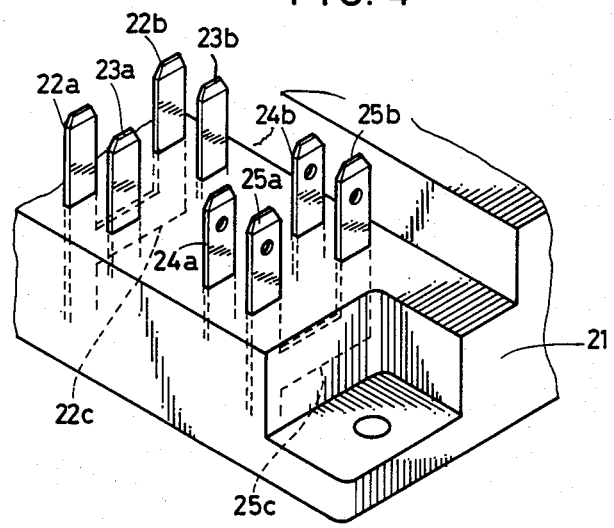
FIG. 4 is an enlarged perspective view showing an input signal terminal portion of a semiconductor power module in accordance with an embodiment of the present invention.

FIG. 4 is an enlarged perspective view showing a signal terminal portion of a power module in accordance with an embodiment of the present invention.

The power module 21 also contains two transistor devices. A base signal terminal 22 connected to a base electrode of one transistor device is bifurcated by bifurcating portion 22c within the power module 21 and thus two base signal terminals 22a and 22b are projected to an exterior. Similarly, two emitter signal terminals 23a and 23b are also projected to an exterior from an emitter electrode contained in the power module 21. In addition, another base signal terminals 25a and 25b for another transistor device are projected to an exterior from a base electrode of another transistor device and another emitter signal terminals 24a and 24b are also projected to an exterior from an emitter electrode. 25c indicates an internal bifurcating portion.

Figure 5:
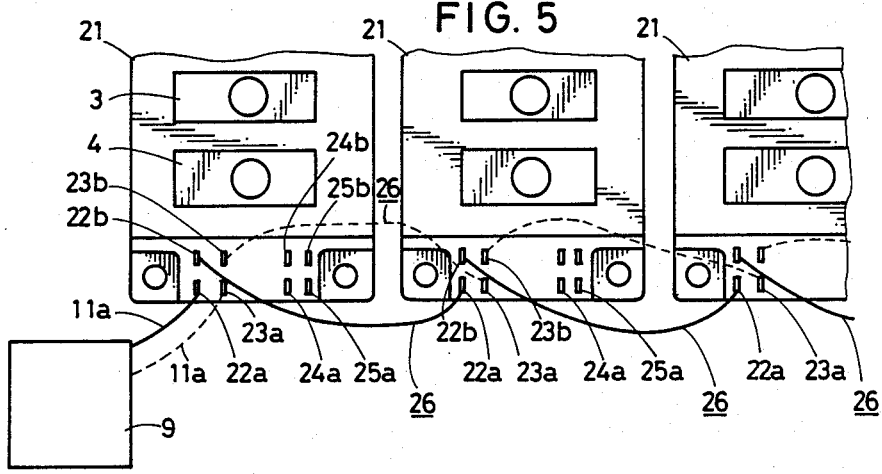
FIG. 5 is a plan view showing a parallel connection of a plurality of semiconductor power modules in accordance with the present invention.

FIG. 5 shows a parallel connection of a plurality of power modules 21 structured as shown in FIG. 4, in which each signal terminal is connected in parallel. The control signal generating apparatus 9 is connected to the base signal terminal 22a in the first power module 1 through a connecting wire 11a. The base signal terminal 22b which is bifurcated from the base signal terminal 22a is connected to the base signal terminal 22a in the second power module 21 by a wiring apparatus 26 for connection. The base signal terminal 22b which is bifurcated from the base signal terminal 22a is connected to the base signal terminal 22a in the third power module 21 by the wiring apparatus 26, and so on. In addition, as shown in a dotted line, the control signal generating apparatus 9 is connected to the emitter signal terminal 23a in the first power module 21 though a connecting wire 11a; the emitter signal terminal 23b bifurcated from the emitter signal terminal 23a in the first power module 1 is connected to the emitter signal terminal 23a in the second power module 21; and so on. Thus, a parallel connection is made. Although not shown, each signal terminal for other transistor device is connected in parallel by using a wiring apparatus 26.

Figure 6:
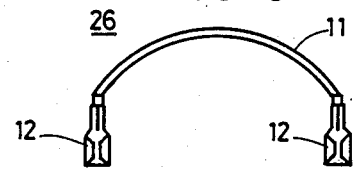
FIG. 6 is a front view of a wiring apparatus for use with the FIG. 5 embodiment.

As described in the foregoing, since two signal terminals project outside the housing for each electrode in each power module 21, a wiring apparatus 26 for connection for transmitting a control signal from the control signal generating apparatus 9 in a parallel manner can be simply structured as shown in FIG. 6. More particularly, the wiring apparatus 26 comprises a connecting wire 11 and two connecting contacts 12 in the form of spade type connector each connected to one end of the wire 11. It can be easily understood that if a plurality of power modules 21 are connected in parallel with each other, the wiring apparatuses 26, the number of which corresponds to the number of parallel connections, must be prepared. If the number of parallel connections changes, correspondingly the number of wiring apparatuses 26 is increased or decreased.

Although in the above described embodiment, the present invention applies to a semiconductor power module, the same also applies to other kind of semiconductor apparatuses.

As described in the foregoing, in accordance with the present invention, since the two signal terminals are provided for each electrode in each semiconductor apparatus, even if the number of parallel connections of the semiconductor apparatuses changes, it is easily to arrange such parallel connections by changing the number of wiring apparatus each being comprised of a wire and two connecting contacts each connected to one end of the wire, depending on the change of the number of parallel connections. In addition, a wiring apparatus can be standardized and massproduced for pre-preparation, and thus the cost thereof can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising a housing; semiconductor means within the housing for processing electrical signals; and electrode means extending through the housing and in contact with said semiconductor means, said electrode means including a plurality of discrete electrodes, each discrete electrode extending outside said housing and being formed outside as two terminals separated from each other and each adapted to be coupled to a common external signal.

2. The device of claim 1 wherein said two terminals are joined together only within said housing.

3. A system of semiconductor devices, comprising at least two semiconductor devices, each having a housing; semiconductor means within the housing for processing electric signals and a plurality of discrete electrodes extending through the housing in contact with said semiconductor means, each of said discrete electrodes extending outside said housing and being formed outside as two common terminals spaced apart from each other to be coupled to a common external signal; and wiring means for interconnecting two of said semiconductor devices in parallel, said wiring means including a single wire with one contact respectively on opposite ends of said wiring being detachably coupled between one of said common terminals of different ones of said semiconductor devices, wherein only said single wire is attached to and extends between said contacts and corresponding ones of said two terminals without the intermediary of another connective structure.

4. The system of claim 3, wherein said two terminals of each said electrode are formed together only within said housing.

* * * * *